US009196810B2

(12) United States Patent
Odnoblyudov et al.

(10) Patent No.: US 9,196,810 B2
(45) Date of Patent: Nov. 24, 2015

(54) VERTICAL SOLID-STATE TRANSDUCERS HAVING BACKSIDE TERMINALS AND ASSOCIATED SYSTEMS AND METHODS

(71) Applicant: Micron Technology, Inc., Boise, ID (US)

(72) Inventors: Vladimir Odnoblyudov, Eagle, ID (US); Martin F. Schubert, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 49 days.

(21) Appl. No.: 13/863,625

(22) Filed: Apr. 16, 2013

(65) Prior Publication Data
US 2013/0228815 A1 Sep. 5, 2013

Related U.S. Application Data

(62) Division of application No. 13/218,289, filed on Aug. 25, 2011, now Pat. No. 8,497,146.

(51) Int. Cl.
*H01L 33/62* (2010.01)
*H01L 33/00* (2010.01)
(Continued)

(52) U.S. Cl.
CPC ............ *H01L 33/62* (2013.01); *H01L 33/0079* (2013.01); *H01L 33/382* (2013.01);
(Continued)

(58) Field of Classification Search
CPC ................... H01L 31/0224; H01L 31/022433; H01L 33/36; H01L 33/38; H01L 33/382; H01L 33/387
USPC ............................................ 438/98; 257/459
See application file for complete search history.

(56) References Cited

U.S. PATENT DOCUMENTS 6,649,437 B1 11/2003 Yang et al.
7,115,896 B2 10/2006 Guo et al.
(Continued)

FOREIGN PATENT DOCUMENTS

KR 20070076895 A 7/2007
KR 100752717 B1 8/2007
(Continued)

OTHER PUBLICATIONS

International Search Report and Written Opinion issued Feb. 28, 2013 in International Application No. PCT/US2012/051057, 9 pages.

(Continued)

*Primary Examiner* — Kevin Parendo
(74) *Attorney, Agent, or Firm* — Perkins Coie LLP

(57) ABSTRACT

Vertical solid-state transducers ("SSTs") having backside contacts are disclosed herein. An SST in accordance with a particular embodiment can include a transducer structure having a first semiconductor material at a first side of the SST, a second semiconductor material at a second side of the SST opposite the first side, and an active region between the first and second semiconductor materials. The SST can further include first and second contacts electrically coupled to the first and second semiconductor materials, respectively. A portion of the first contact can be covered by a dielectric material, and a portion can remain exposed through the dielectric material. A conductive carrier substrate can be disposed on the dielectric material. An isolating via can extend through the conductive carrier substrate to the dielectric material and surround the exposed portion of the first contact to define first and second terminals electrically accessible from the first side.

10 Claims, 16 Drawing Sheets

(51) Int. Cl.
  *H01L 33/38* (2010.01)
  *H01L 33/44* (2010.01)
  *H01L 33/64* (2010.01)

(52) U.S. Cl.
  CPC .............. *H01L 33/387* (2013.01); *H01L 33/44* (2013.01); *H01L 33/647* (2013.01); *H01L 2924/0002* (2013.01); *H01L 2933/0033* (2013.01)

(56) References Cited

U.S. PATENT DOCUMENTS

| | | | |
|---|---|---|---|
| 7,393,705 | B1 | 7/2008 | Urbanek |
| 7,420,221 | B2 | 9/2008 | Nagai |
| 7,646,033 | B2 | 1/2010 | Tran et al. |
| 7,723,718 | B1 | 5/2010 | Doan et al. |
| 7,741,632 | B2 | 6/2010 | Xiong et al. |
| 7,758,695 | B2 | 7/2010 | Xiong et al. |
| 7,846,751 | B2 | 12/2010 | Wang |
| 8,361,880 | B2 | 1/2013 | Jiang et al. |
| 8,435,816 | B2 | 5/2013 | Xiong et al. |
| 2001/0022370 | A1 | 9/2001 | Meyer-Guldner |
| 2006/0079082 | A1 | 4/2006 | Bruhns et al. |
| 2007/0221944 | A1 | 9/2007 | Cheol Yoo |
| 2008/0006836 | A1 | 1/2008 | Lee |
| 2008/0048206 | A1 | 2/2008 | Lee et al. |
| 2008/0142814 | A1 | 6/2008 | Chu et al. |
| 2008/0173884 | A1* | 7/2008 | Chitnis et al. .................. 257/98 |
| 2009/0134420 | A1 | 5/2009 | Nagai |
| 2009/0283787 | A1* | 11/2009 | Donofrio et al. ............... 257/98 |
| 2010/0078656 | A1 | 4/2010 | Seo et al. |
| 2010/0155766 | A1 | 6/2010 | Ku |
| 2010/0213893 | A1 | 8/2010 | Yamazaki et al. |
| 2010/0244263 | A1 | 9/2010 | Lin et al. |
| 2010/0314605 | A1 | 12/2010 | Khan |
| 2010/0314647 | A1 | 12/2010 | Won et al. |
| 2011/0140080 | A1 | 6/2011 | Xiong et al. |
| 2011/0156064 | A1 | 6/2011 | Seo et al. |
| 2011/0169040 | A1 | 7/2011 | Seo et al. |
| 2012/0007044 | A1 | 1/2012 | Seo et al. |
| 2012/0007101 | A1 | 1/2012 | Yang et al. |
| 2012/0074441 | A1 | 3/2012 | Seo et al. |
| 2013/0026499 | A1 | 1/2013 | Odnoblyudov |
| 2013/0052759 | A1 | 2/2013 | Odnoblyudov et al. |

FOREIGN PATENT DOCUMENTS

| | | |
|---|---|---|
| KR | 20110078484 A | 7/2011 |
| WO | 2010020077 A1 | 2/2010 |

OTHER PUBLICATIONS

Philips Lumileds LUXEON Rebel White LED Product Image, Retrieved from the Internet on Jul. 16, 2011, URL: http://www.philipslumileds.com/products/luxeon-rebel/luxeon-rebel-white, 1 page.

Shchekin, O. and D. Sun, Evolutionary new chip design targets lighting systems, Compound Semiconductor, vol. 13, No. 2, pp. 16-18, Mar. 2007, Institute of Physics Publishing and IOP Publishing Ltd.

* cited by examiner

VERTICAL SOLID-STATE TRANSDUCERS HAVING BACKSIDE TERMINALS AND ASSOCIATED SYSTEMS AND METHODS

CROSS-REFERENCE TO RELATED APPLICATION

This application is a divisional of U.S. application Ser. No. 13/218,289 filed Aug. 25, 2011, which is incorporated herein by reference.

TECHNICAL FIELD

The present technology is related to solid-state transducers and methods of manufacturing solid-state transducers. In particular, the present technology relates to vertical solid-state transducers having backside terminals and associated systems and methods.

BACKGROUND

Mobile phones, personal digital assistants ("PDAs"), digital cameras, MP3 players, and other electronic devices utilize light-emitting diodes ("LEDs"), organic light-emitting diodes ("OLEDs"), polymer light-emitting diodes ("PLEDs"), and other solid-state transducer devices for backlighting. Solid-state transducer devices are also used for signage, indoor lighting, outdoor lighting, and other types of general illumination. FIG. 1A is a cross-sectional view of a conventional LED device 10a with lateral contacts. As shown in FIG. 1A, the LED device 10a includes a substrate 20 carrying an LED structure 11 having an active region 14, e.g., containing gallium nitride/indium gallium nitride (GaN/InGaN) multiple quantum wells ("MQWs"), positioned between N-type GaN 15 and P-type GaN 16. The LED device 10a also includes a first contact 17 on the P-type GaN 16 and a second contact 19 on the N-type GaN 15. The first contact 17 typically includes a transparent and conductive material (e.g., indium tin oxide ("ITO")) to allow light to escape from the LED structure 11.

FIG. 1B is a cross-sectional view of another conventional LED device 10b in which the first and second contacts 17 and 19 are opposite each other, e.g., in a vertical rather than lateral configuration. During formation of the LED device 10b, the N-type GaN 15, the active region 14 and the P-type GaN 16 are stacked sequentially on a growth substrate (not shown), similar to the substrate 20 shown in FIG. 1A. The first contact 17 is formed on the P-type GaN 16, and a carrier substrate 21 is attached to the first contact 17. The growth substrate is then removed and the second contact 19 is formed on the N-type GaN 15. The structure is then inverted to produce the orientation shown in FIG. 1B. A converter material 23 and an encapsulant 25 can then be positioned over one another on the LED structure 11. In operation, the LED structure 11 can emit a first emission (e.g., blue light) that stimulates the converter material 23 (e.g., phosphor) to emit a second emission (e.g., yellow light). The combination of the first and second emissions can generate a desired color of light (e.g., white light).

The vertical LED device 10b has enhanced current spreading, light extraction, thermal properties, and accordingly a higher efficiency than the lateral LED device 10a of FIG. 1A. However, despite improved thermal properties, the LED device 10b still produces a significant amount of heat such that the differences between the coefficients of thermal expansion of the LED structure 11 and the underlying carrier substrate 21 can cause delamination between the two components and/or other damage to the packaged device. Additionally, as shown in FIG. 1B, the vertical LED device 10b requires access to both sides of the die to form electrical connections with the first and second contacts 17 and 19, and typically includes at least one wirebond coupled to the second contact 19. Wirebond connections take up more space and require more intricate formation techniques than other electrical coupling methods (e.g., solder reflow processes), and therefore may be ill-suited for applications with tight die spacing. Moreover, various portions of the LED device 10b (e.g., the converter material 23, the encapsulant 25) are formed after singulation at a die level (FIG. 1B), and thus require precise handing that further increases manufacture time and cost. Accordingly, there remains a need for vertical LEDs and other solid-state devices that facilitate packaging and have improved the performance and reliability.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. Moreover, in the drawings, like reference numerals designate corresponding parts throughout the several views.

DETAILED DESCRIPTION

Specific details of several embodiments of solid-state transducers ("SSTs") and associated systems and methods are described below. The term "SST" generally refers to solid-state devices that include a semiconductor material as the active medium to convert electrical energy into electromagnetic radiation in the visible, ultraviolet, infrared, and/or other spectra. For example, SSTs include solid-state light emitters (e.g., LEDs, laser diodes, etc.) and/or other sources of emission other than electrical filaments, plasmas, or gases. SSTs can alternately include solid-state devices that convert electromagnetic radiation into electricity. Additionally, depending upon the context in which it is used, the term "substrate" can refer to a wafer-level substrate or to a singulated device-level substrate. A person skilled in the relevant art will also understand that the technology may have additional embodiments, and that the technology may be practiced without several of the details of the embodiments described below with reference to FIGS. 2A-5.

FIGS. 2A-2K are schematic backside plan and cross-sectional views illustrating a process for forming SSTs 200 in accordance with an embodiment of the present technology. For illustrative purposes, FIGS. 2A-2G show stages of the process on an individual SST 200 and FIGS. 2H-2K show stages of the process on a wafer-level assembly 250 having a plurality of SSTs 200. A person skilled in the art will recognize that each stage of the process can be performed at the wafer level or at the die level.

Figure 1A:
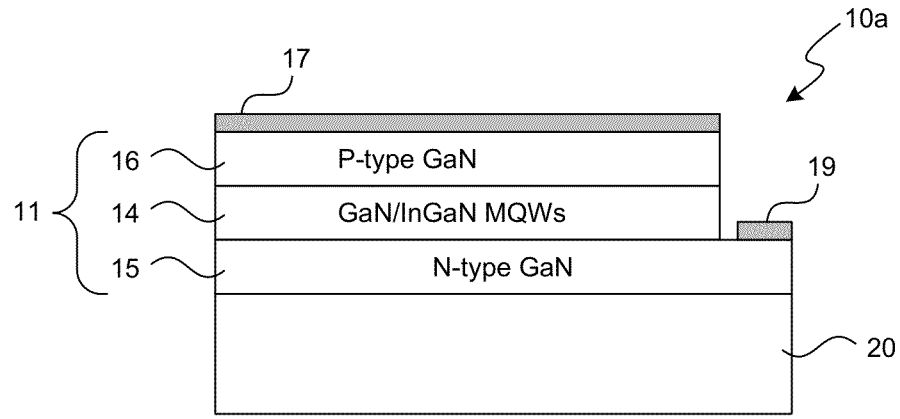
FIG. 1A is a schematic cross-sectional diagram of an LED device configured in accordance with the prior art.
Figure 1B:
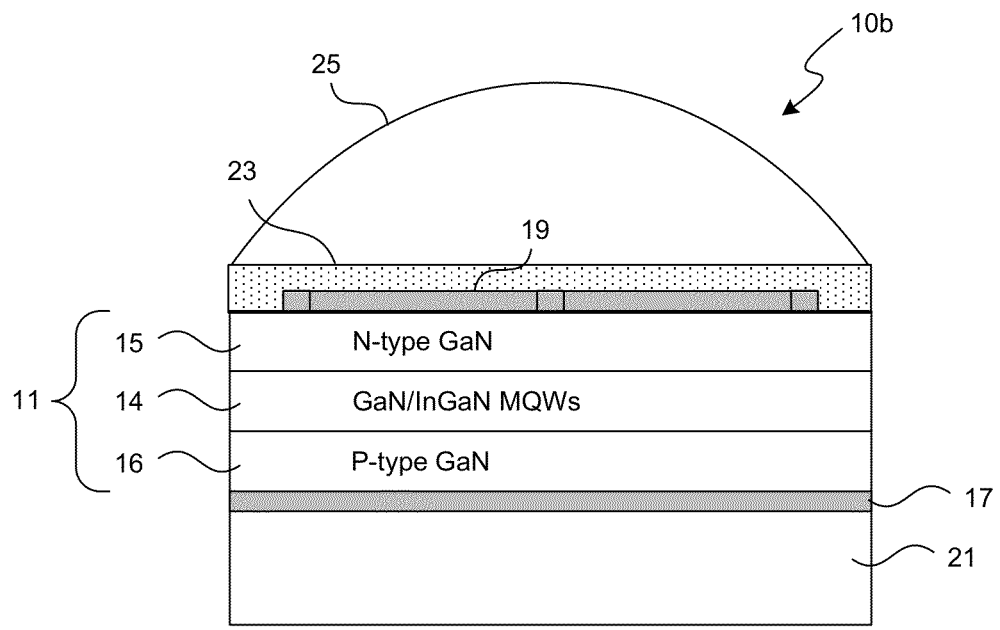
FIG. 1B is a schematic cross-sectional diagram of another LED device configured in accordance with the prior art.
Figure 2A:
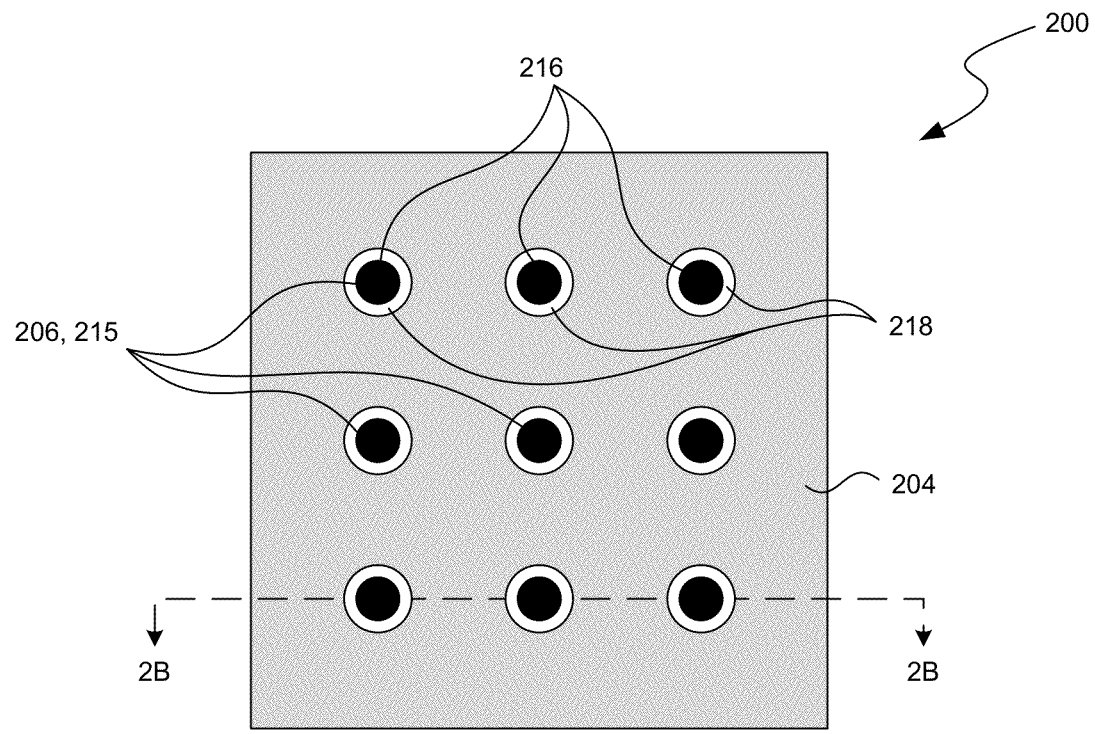
FIGS. 2A-2K are schematic backside plan and cross-sectional views illustrating a process for forming solid-state transducers in accordance with an embodiment of the present technology.
Figure 2B:
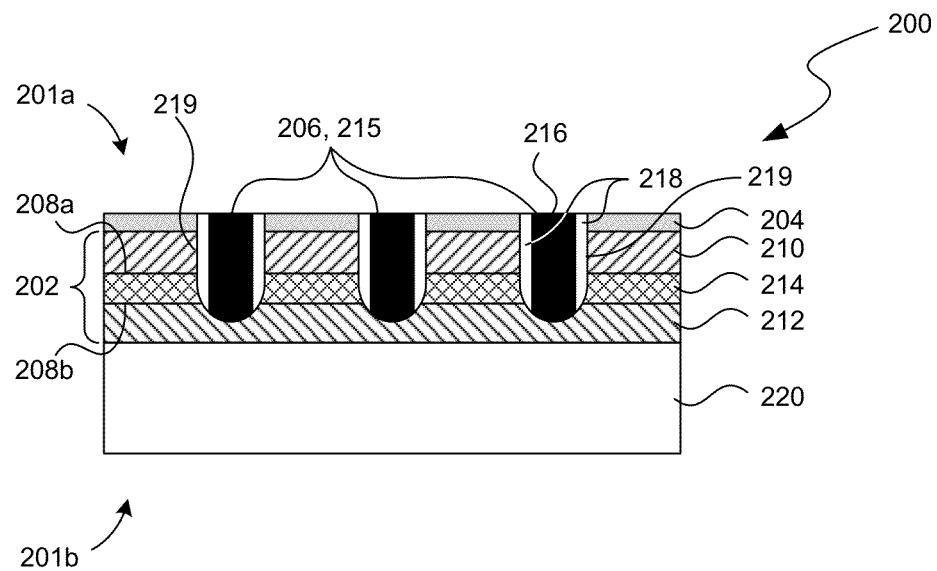

FIGS. 2A and 2B are backside plan and cross-sectional views, respectively, illustrating the SST 200 at a stage of the process after a transducer structure 202 has been formed on a growth substrate 220. As shown in FIG. 2B, the SST 200 has a first side 201a and a second side 201b facing away from the first side 201a. The transducer structure 202 can include an active region 214, a first semiconductor material 210 at a first side 208a of the active region 214, and a second semiconductor material 212 at a second side 208b of the active region opposite the first side 208a of the active region 214. A first contact 204 can be formed on the first semiconductor material 210. A second contact 206 can include a plurality of buried contact elements 215 that extend from the first side 201a of the SST 200 to or into the second semiconductor material 212. Accordingly, as shown in FIGS. 2A and 2B, both the first and second contacts 204 and 206 are electrically accessible from the first side 201a of the SST 200.

As used herein, elements positioned on or at the first side 201a of the SST 200 are positioned in the region from the first side 208a of the active region 214 to the external surface. Elements positioned on or at the second side 201b of the SST 200 are positioned in the region from the second side 201b of the active region 214 to the opposing external surface. As materials are added to or removed from the SST 200 during different phases of the formation process, the exterior surfaces of the first and second sides 201a and 201b of the SST 200 may change. However, the first side 201a of the SST 200 is consistently bounded internally by the first side 208a of the active region 214, and the second side 201b is consistently bounded internally by the second side 208b of the active region 214.

The first and second semiconductor materials 210 and 212 can be doped semiconductor materials. For example, the first semiconductor material 210 can be a P-type semiconductor material (e.g., P-GaN), and the second semiconductor material 212 can be an N-type semiconductor material (e.g., N-GaN). This configuration is suitable when the transducer structure 202 is formed on an opaque or translucent growth substrate 220 and subsequently attached to a carrier substrate. In other embodiments, the first and second semiconductor materials 210 and 212 may be reversed. The active region 214 between the first and second semiconductor materials 210 and 212 can include a single quantum well ("SQW"), MQWs, and/or a single grain semiconductor material (e.g., InGaN). In other embodiments, the transducer structure 202 can include other suitable semiconductor materials, such as gallium arsenide (GaAs), aluminum gallium arsenide (AlGaAs), gallium arsenide phosphide (GaAsP), etc.), and/or other semiconductor materials. The transducer structure 202 can be formed via metal organic chemical vapor deposition ("MOCVD"), molecular beam epitaxy ("MBE"), liquid phase epitaxy ("LPE"), and/or hydride vapor phase epitaxy ("HVPE"). In other embodiments, at least a portion of the transducer structure 202 may be formed using other suitable epitaxial growth techniques.

As shown in FIG. 2A, the first contact 204 can extend over a large portion of the underlying first semiconductor material 210. In other embodiments, the first contact 204 can be formed over a smaller portion of the first semiconductor material 210. The first contact 204 can be made from a reflective contact material, including nickel (Ni), silver (Ag), copper (Cu), aluminum (Al), tungsten (W), and/or other reflective materials. During subsequent processing stages, the transducer structure 202 may be inverted such that the reflective first contact 204 can redirect emissions (e.g., light) back through the transducer structure 202 toward the second side 201b of the SST 200. In other embodiments, the first contact 204 can be made from non-reflective materials, and the SST 200 can include separate reflective elements positioned at the first side 201a of the SST 200. In further embodiments, the SSTs 200 do not include reflective elements. The first contact 204 can be formed using chemical vapor deposition ("CVD"), physical vapor deposition ("PVD"), atomic layer deposition ("ALD"), spin coating, patterning, and/or other suitable techniques known in the semiconductor fabrication arts.

The buried contact elements 215 can be formed by etching or otherwise forming a plurality of trenches 219 that extend from the first side 201a of the SST 200 (e.g., the first contact 204 or the first semiconductor material 210) to or into the second semiconductor material 212. For example, the trenches 219 can be formed before the first contact 204 and can begin at the backside of the first semiconductor material 210, or the trenches 219 can be formed after the first contact 204 and begin at the backside of the first contact 204. The sidewalls of the trenches 219 can be coated with a dielectric material 218, and a second contact material 216 can be disposed in the trenches 219 on the dielectric material 218. The second contact material 216 can also be disposed on an exposed portion of the second semiconductor material 212 and electrically coupled thereto. The dielectric material 218 can electrically isolate the second contact material 216 from the active region 214, the first semiconductor material 210, and the first contact 204. The dielectric material 218 can include silicon dioxide ($SiO_2$), silicon nitride (SiN), and/or other suitable dielectric materials, and the second contact material 216 can include titanium (Ti), aluminum (Al), nickel (Ni), silver (Ag), and/or other suitable conductive materials. The second contact material 216 and the dielectric material 218 can be deposited using CVD, PVD, ALD, patterning, and/or other suitable techniques known in the art.

Figure 2C:
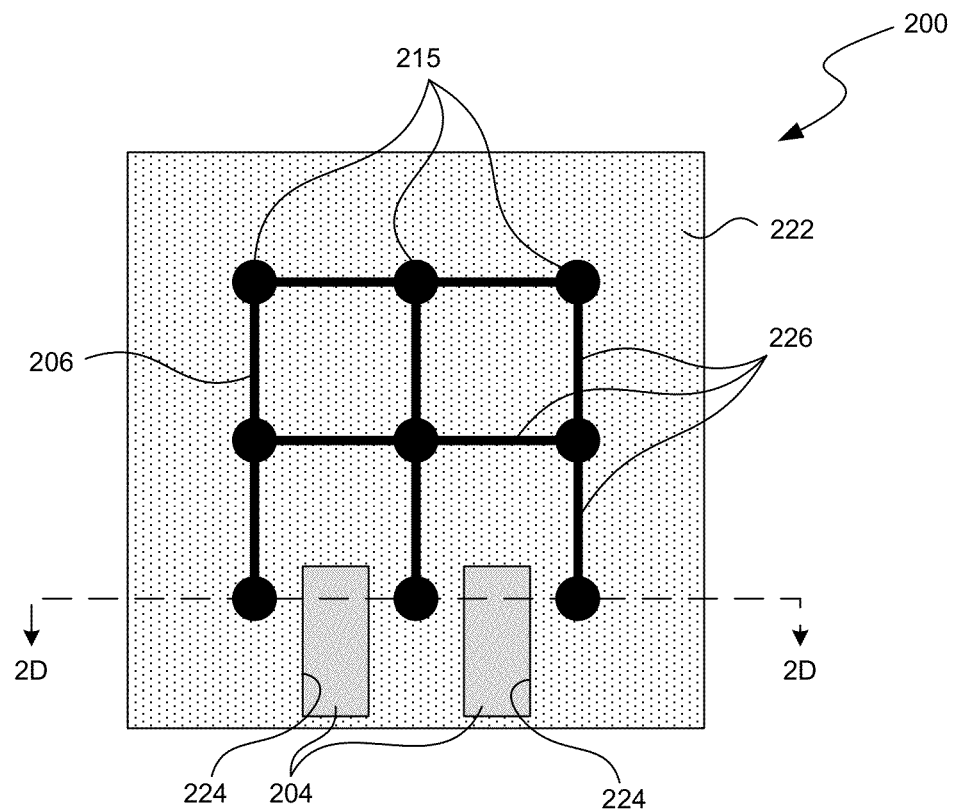
Figure 2D:
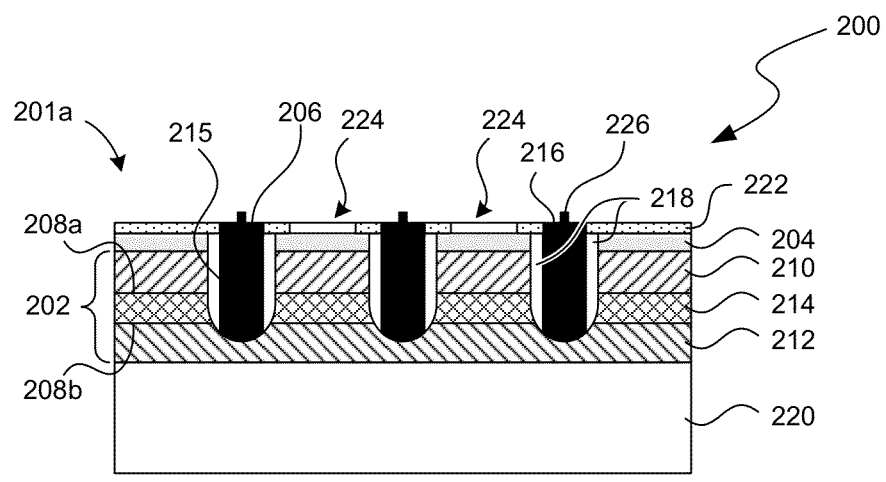

FIGS. 2C and 2D illustrate a stage in the process after a dielectric material 222 has been formed over the first contact 204. The dielectric material 222 can be the same as or different from the dielectric material 218 in the trenches 219. For example, the dielectric material 222 can include silicon nitride (SiN), silicon dioxide ($SiO_2$), and/or other suitable constituents. As shown in FIG. 2D, the dielectric material 222 can include openings 224 that expose portions of the first contact 204. In the illustrated embodiment, the dielectric material 222 includes two rectangular openings 224. In other embodiments, however, the dielectric material 222 can include more or fewer openings 224 and/or the openings 224 can have different shapes (e.g., square, circular, irregular, etc.). The dielectric material 222 can be formed using CVD, PVD, patterning, spin coating, and/or other suitable formation methods. The openings 224 can be formed by selectively depositing or selectively removing portions of the dielectric material 222.

As shown in FIGS. 2C and 2D, the dielectric material does not cover the buried contact elements 215 such that conductive lines 226 (FIG. 2C) can be formed between the buried contact elements 215. The conductive lines 226 can be made from a suitable electrically conductive material, such as nickel (Ni), silver (Ag), copper (Cu), aluminum (Al), tungsten (W) and/or other suitable conductive materials. The conductive lines 226 can electrically couple and interconnect the buried contact elements 215 and form the second contact 206. The dielectric material 222 underlying the conductive lines 226 electrically isolates the first contact 204 from the second contact 206. The conductive lines 226 can be forming using deposition, patterning, and/or other suitable methods known in the art, and can be made from similar electrically conductive materials as the second contact material 216.

Figure 2E:
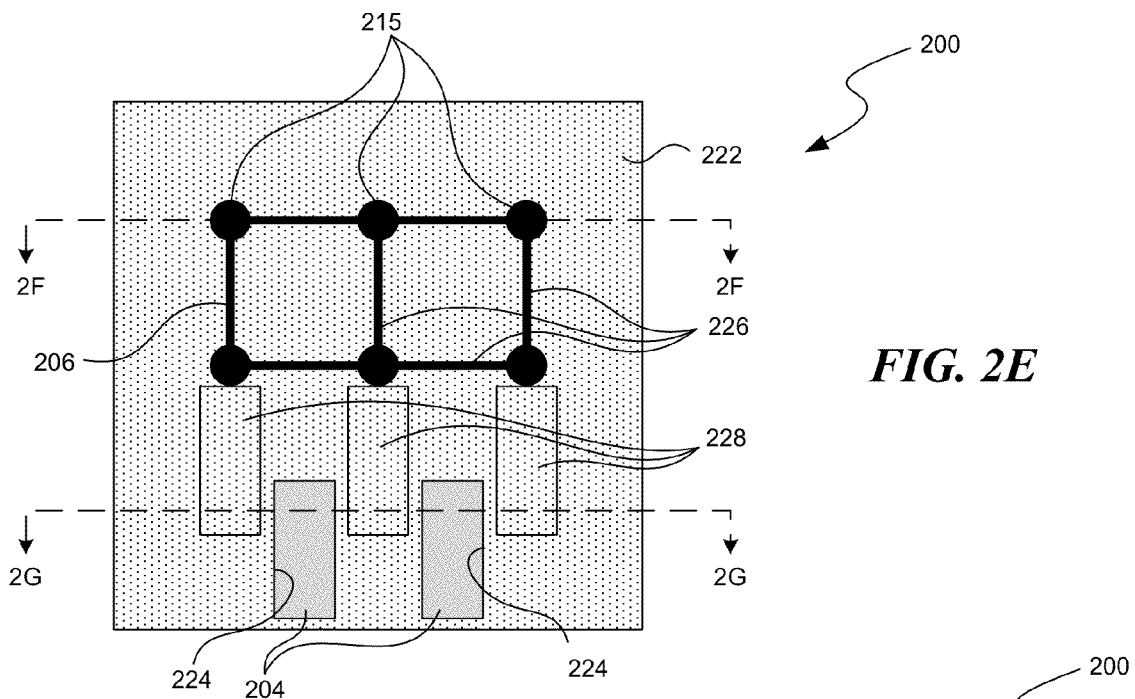
Figure 2F:
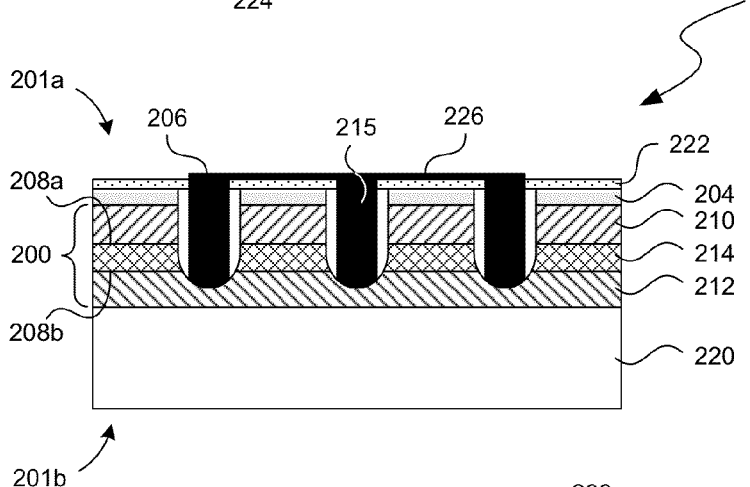
Figure 2G:
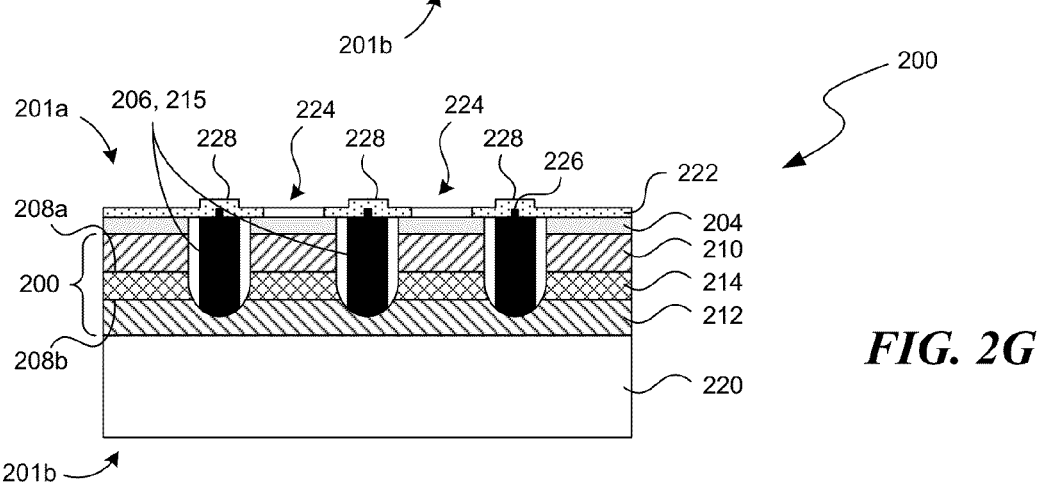

FIGS. 2E-2G illustrate a stage in the process during which dielectric portions 228 (e.g., SiN, $SiO_2$, etc.) are positioned over portions of the second contact 206. The dielectric portions 228 can be selectively deposited (e.g., CVD, PVD, etc.) over portions of the second contact 206 and/or pre-formed and positioned over portions of the second contact 206. In the illustrated embodiment, the dielectric portions 228 are positioned over the portions of the second contact 206 proximate the exposed first contact 204. This configuration spaces the exposed first and second contacts 204 and 206 laterally apart from one another, and therefore reduces the likelihood of shorting the contacts to each other during subsequent processing. In other embodiments, the SSTs 200 can include more or fewer dielectric portions 228 that cover greater or smaller portions of the second contact 206. For example, the dielectric portions 228 can be omitted such that the entire second contact 206 is exposed.

Figure 2H:
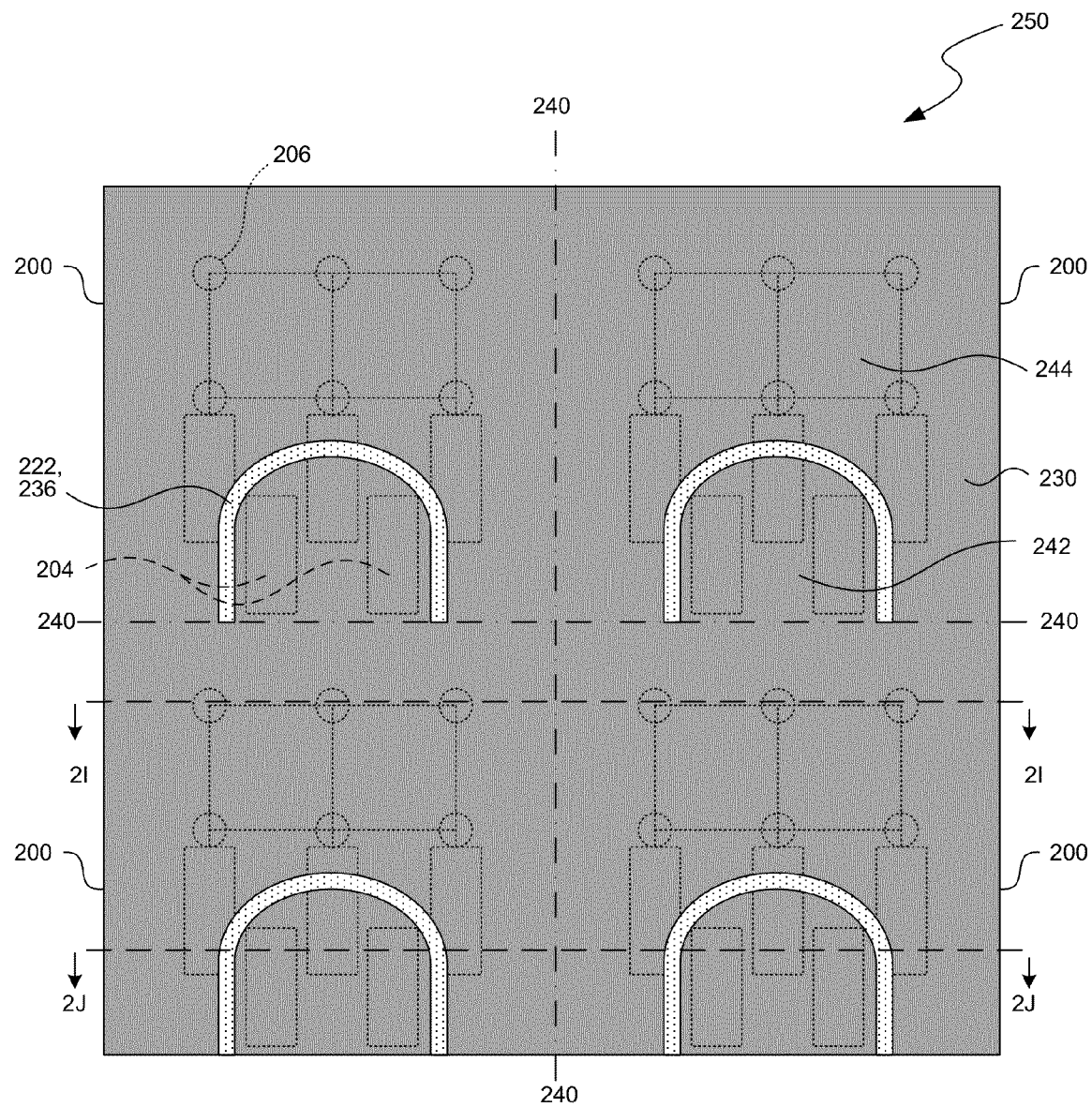
Figure 2I:
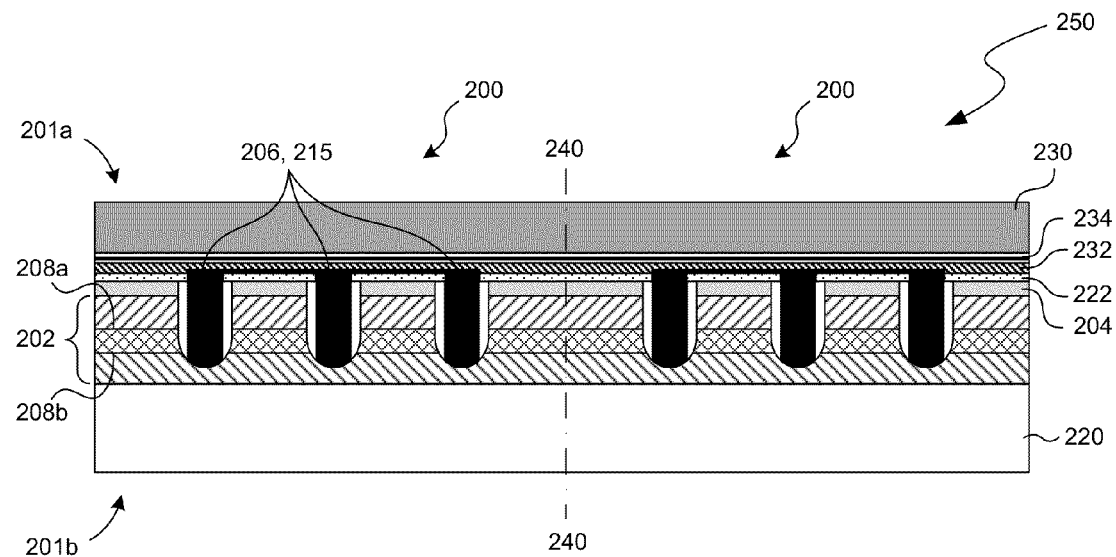
Figure 2J:
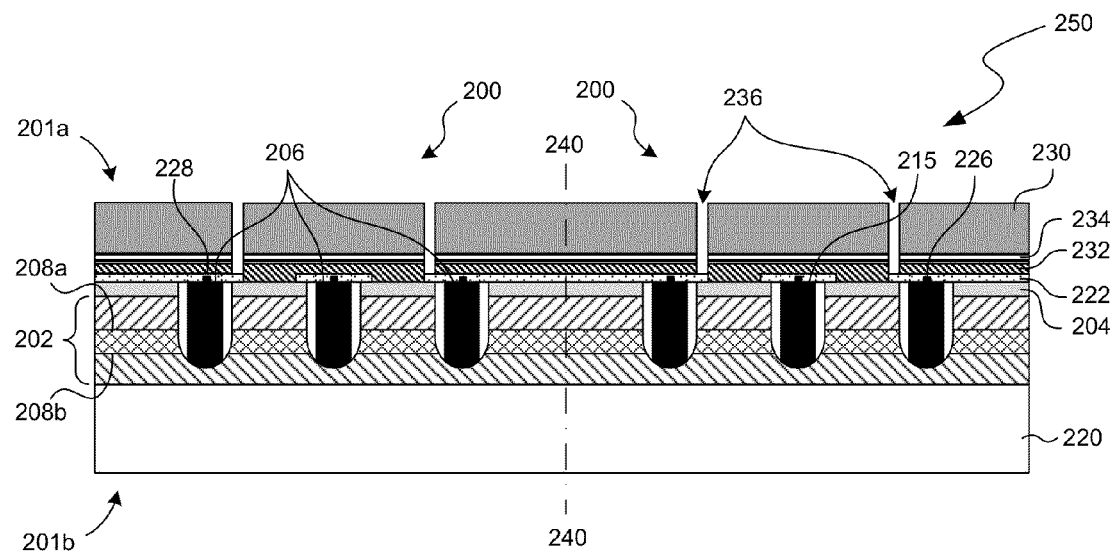

FIGS. 2H-2J illustrate yet another stage in the process after a conductive carrier substrate 230 ("carrier substrate 230") has been formed over the first side 201a of the SST 200. As shown in FIGS. 2I and 2J, a barrier material 232 (e.g., WTi, Ta, TaN), an optional seed material 234 (e.g., Cu, Ni), and the carrier substrate 230 can be formed sequentially over the first side 201a of the SST 200. The barrier and seed materials 232 and 234 can be formed using CVD, PVD, ALD, patterning, and/or other suitable methods. In some embodiments, the carrier substrate 230 can be made from metal (e.g., copper) and plated onto the seed material 234. Plating the carrier substrate 230 onto the transducer structure 202, rather than joining the two with thermo-compression or inter-metallic compound bonding, reduces the amount of bowing in the carrier substrate 230. This reduction in bowing facilitates the use of a larger diameter assembly 250, and therefore allows more SSTs 200 to be processed at once. In several embodiments, for example, the assembly 250 can be at least four inches in diameter, and in many cases between six and eight inches in diameter.

In other embodiments, additional materials can be formed over the first side 201a of the SST 200 and/or some of the materials can be omitted. For example, in some embodiments, the process can include depositing and patterning a solder metal on the backside of the carrier substrate 230. The pre-application of the solder metal can facilitate subsequent solder bonding processes.

As further shown in FIGS. 2I and 2J, the barrier material 232 can contact the portions of the second contact 206 that were not covered by the dielectric material 222 (FIG. 2I) and the portions of the first contact 204 that were not covered by the dielectric material 222 (FIG. 2J), and therefore electrically couple the barrier material 232 and any conductive material formed thereon (e.g., the seed material 234, the carrier substrate 230, etc.) to the first and second contacts 204 and 206. To decouple the first and second contacts 204 and 206 from one another, an isolating via 236 (FIGS. 2H and 2J) extending through the carrier substrate 230 to the dielectric material 222 can be formed by processes known in the art around the exposed portions of the first contact 204 and/or the exposed portions of the second contact 206. In the embodiment illustrated in FIG. 2H, for example, the isolating via 236 encloses the exposed portions of the first contact 204. The portion of the carrier substrate 230 surrounded by the isolating via 236 defines a first terminal 242 that is electrically coupled to the first contact 204, and the remaining portion of the carrier substrate 230 defines a second terminal 244 that is coupled to the second contact 206. Accordingly, the first and second contacts 204 and 206 can be accessed from the first side 201a of the SST 200.

In some embodiments, the barrier material 232 and the seed material 234 can be patterned to expose the underlying dielectric material 222 and form the isolating via 236. The carrier substrate 230 can be subsequently plated on the seed material 234 such that the underlying dielectric material 222 remains exposed and the isolating via 236 is preserved. In other embodiments, the barrier material 232, the seed material 234, and/or the carrier substrate 230 can be selectively deposited and/or etched to form the isolating via 236.

Figure 2K:
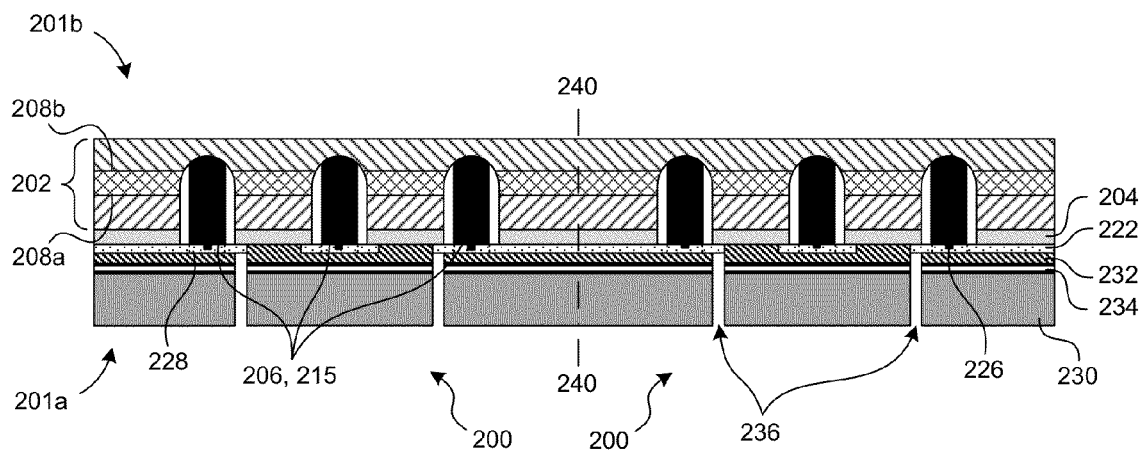

FIG. 2K illustrates an additional stage in the process after the growth substrate 220 has been removed from the transducer structure 202 and the SST 200 has been inverted. The growth substrate 220 can be removed by releasably bonding (e.g., using WaferBOND™ HT-10.10 from Brewer Science, Inc. of Rolla, Mo.) the backside of the carrier substrate 230 to a temporary support substrate and backgrinding, etching (e.g., wet etching, dry etching, etc.), and/or otherwise removing the growth substrate 220 (FIGS. 2I and 2J) from the second semiconductor material 212. In other embodiments, the temporary support substrate is not used. In various embodiments, the process can further include roughening the second semiconductor material 212.

After or before the growth substrate 220 is removed, the assembly 250 can be diced along dicing lanes 240 to separate the individual SSTs 200. The first and second terminals 242 and 244 (FIG. 2H) provide electrical access to the first and second contacts 204 and 206 on the backside (the first side 201a) of the SSTs 200. This forms wirebond-free SSTs 200 that may be suitable for applications with tight die spacing. Additionally, as shown in FIG. 2K, the backside contacts do not block or interfere with the emissions (e.g., light, energy) through the second side 201b of the SST 200, and accordingly enhance the efficiency of the SSTs 200. The carrier substrate 230 can function as a heat sink to decrease the operating temperature of the SSTs 200. Furthermore, in various embodiments, the carrier substrate 230 can also be configured to have a coefficient of thermal expansion generally similar to that of the transducer structure 202 to decrease the likelihood of delamination between the materials of the SSTs 200.

Figure 3A:
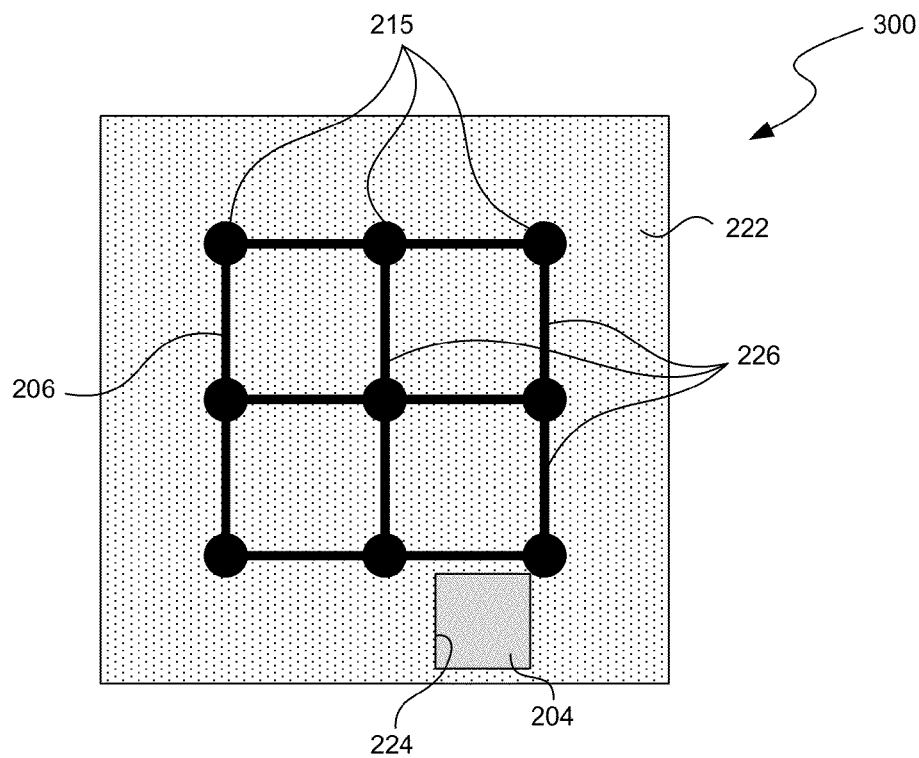
FIGS. 3A-3C are schematic backside plan views illustrating a process of forming solid-state transducers in accordance with another embodiment of the present technology.
Figure 3B:
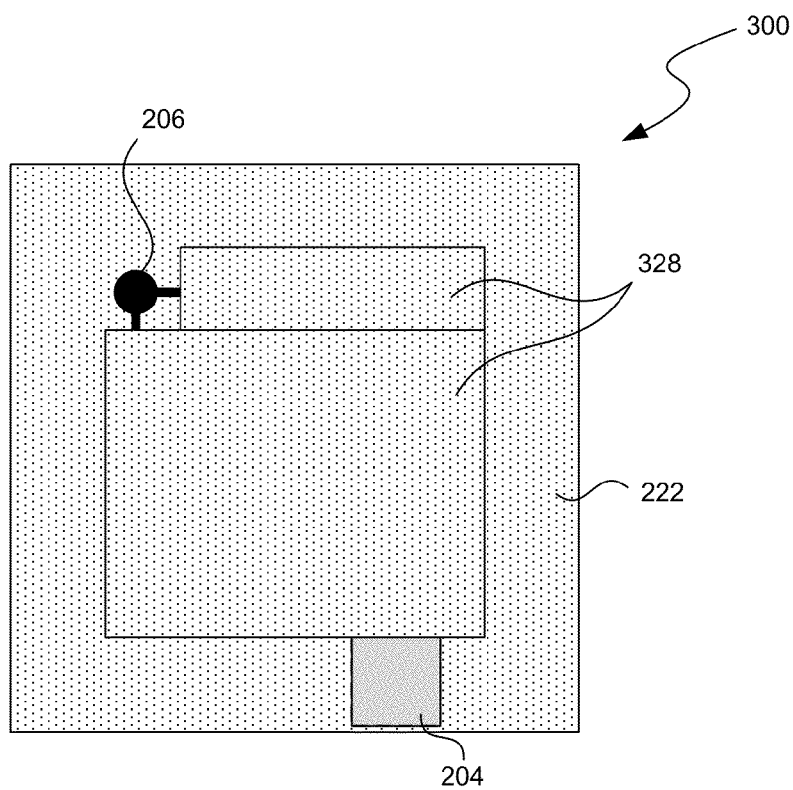
Figure 3C:
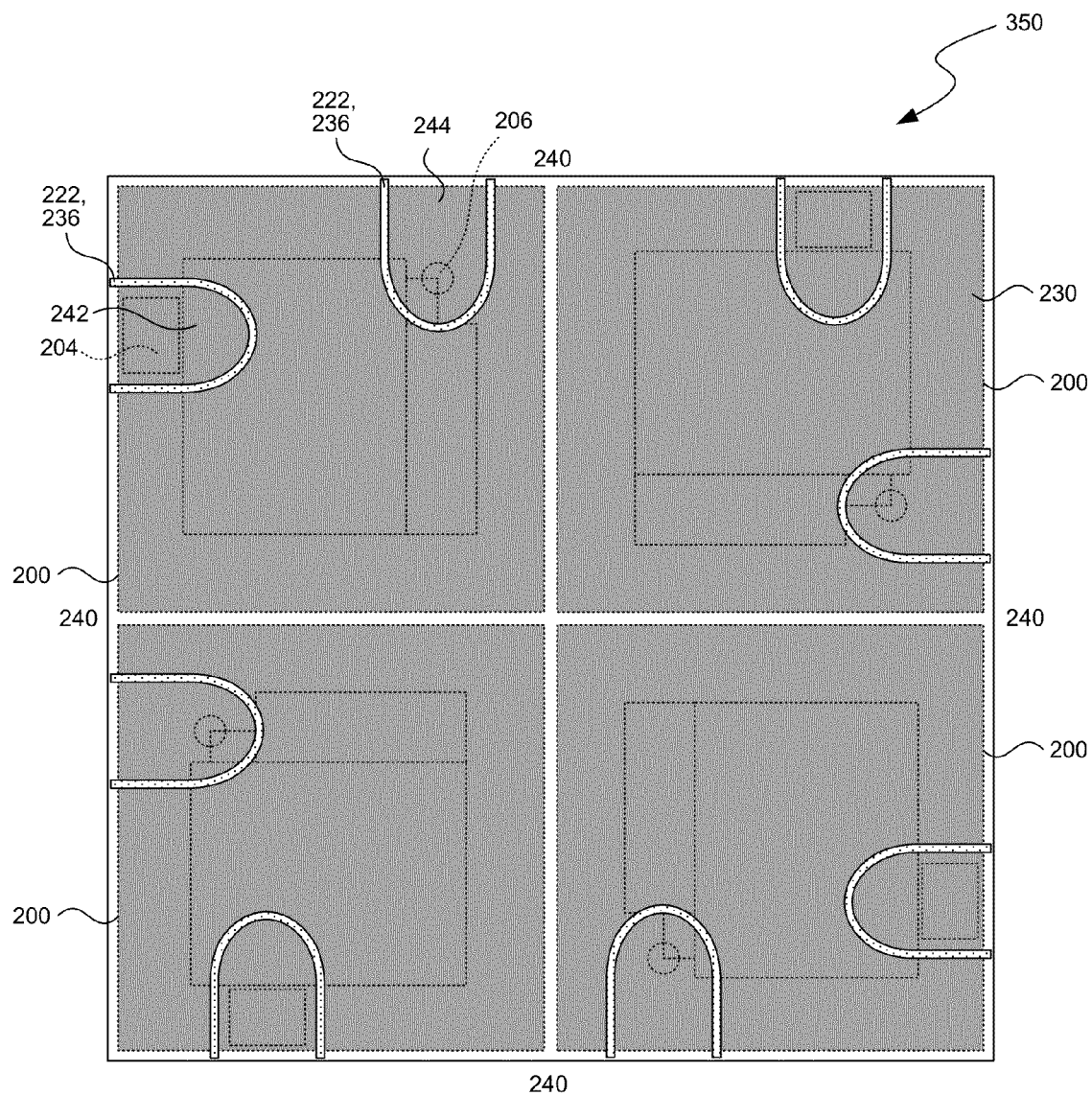

FIGS. 3A-3C are schematic backside plan views illustrating a process of forming SSTs 300 in accordance with another embodiment of the present technology. For illustrative purposes, the process is shown on an individual SST 300 in FIGS. 3A and 3B and on a wafer-level assembly 350 having a plurality of SSTs 300 in FIG. 3C. As a person skilled in the art will recognize, however, any of the stages described below can be performed at the die or wafer level. The SSTs 300 can include generally similar features as the SSTs 200 described above with reference to FIGS. 2A-2K, and can accordingly be formed using generally similar processes. FIG. 3A, for example, shows the SSTs 300 after the dielectric material 222 has been formed over the transducer structure 202 (not shown), and after the buried contact elements 215 have been interconnected with the conductive lines 226 to form the second contact 206. In the embodiment illustrated in FIG. 3A, the portion of the first contact 204 left exposed through the dielectric material 222 is spaced laterally apart from the buried contact elements 215. This allows the additional conducive lines 226 to interconnect the buried contact elements 215, and thereby enhances current spreading across the SSTs 300.

FIGS. 3B and 3C show stages in the process after dielectric portions 328 (FIG. 3B) and the carrier substrate 230 (FIG. 3C) have been formed. As shown in FIG. 3B, the dielectric portions 328 are generally similar to the dielectric portions 228 shown in FIG. 2E, but cover a larger portion of the second contact 206, leaving one of the buried contact elements 215 exposed. As described above with reference to FIGS. 2H-2J, the carrier substrate 230 (FIG. 3C) can be electrically coupled to the first and second contacts 204 and 206 via one or more conductive materials (e.g., barrier and seed materials).

In the embodiment illustrated in FIG. 3C, the SSTs 300 includes two isolating vias 236 electrically decoupling the first and second contacts 204 and 206. One isolating via 236 extends around the exposed portion of the first contact 204 to define the first terminal 242, and another isolating via 236 extends around the exposed portion of the second contact 206 to define the second terminal 244. Accordingly, each of the SSTs 300 on the assembly 350 includes well-demarcated first and second terminals 242 and 244, while the remainder of the carrier substrate 230 is uncoupled from the contacts. Similar to the SSTs 200 described above in FIGS. 2A-2K, the SSTs 300 provide backside electrical access to each of the first and second contacts 204 and 206, and therefore provide wirebond-free packaging with enhanced emission efficiency.

Figure 4A:
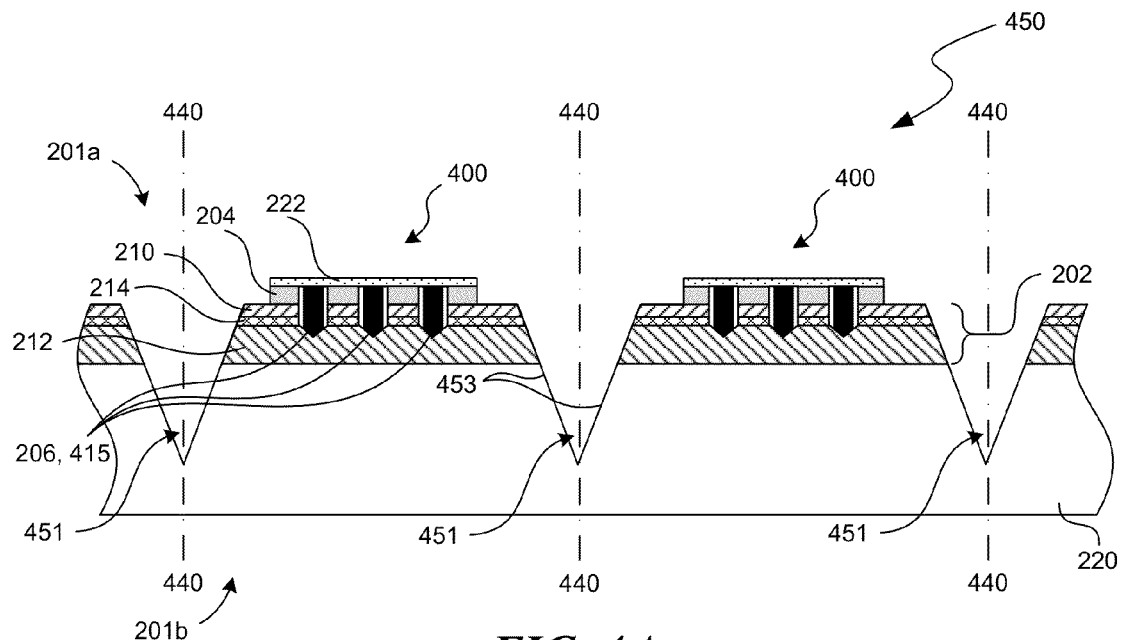
FIGS. 4A-4C are schematic cross-sectional views illustrating a process of forming solid-state transducers in accordance with a further embodiment of the present technology.
Figure 4B:
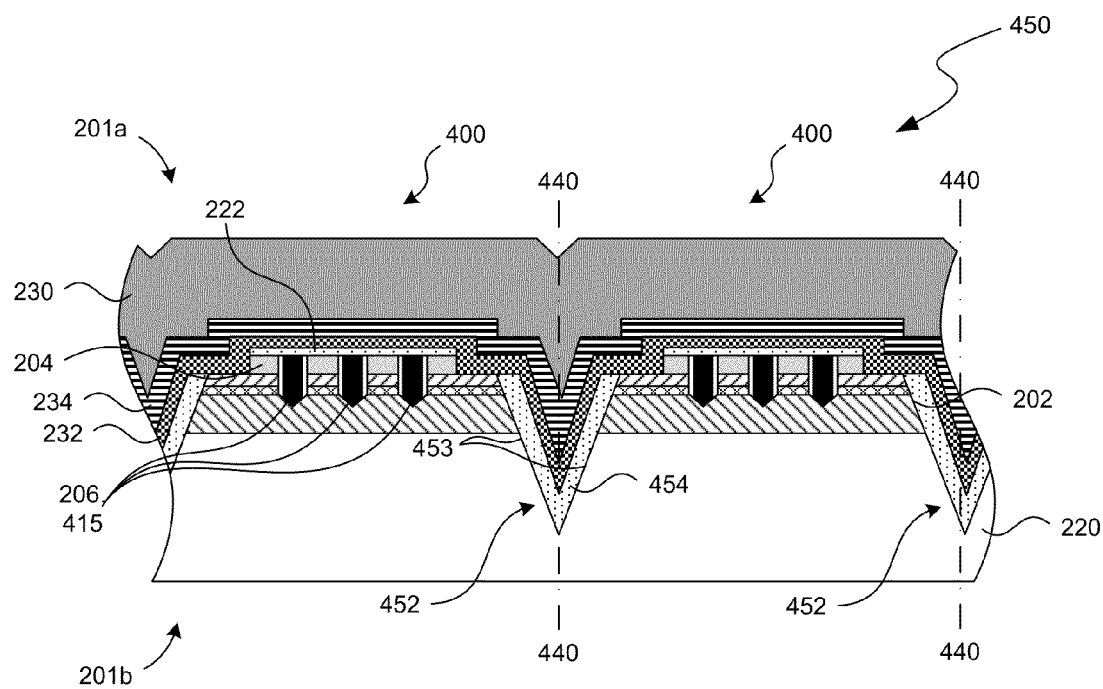
Figure 4C:
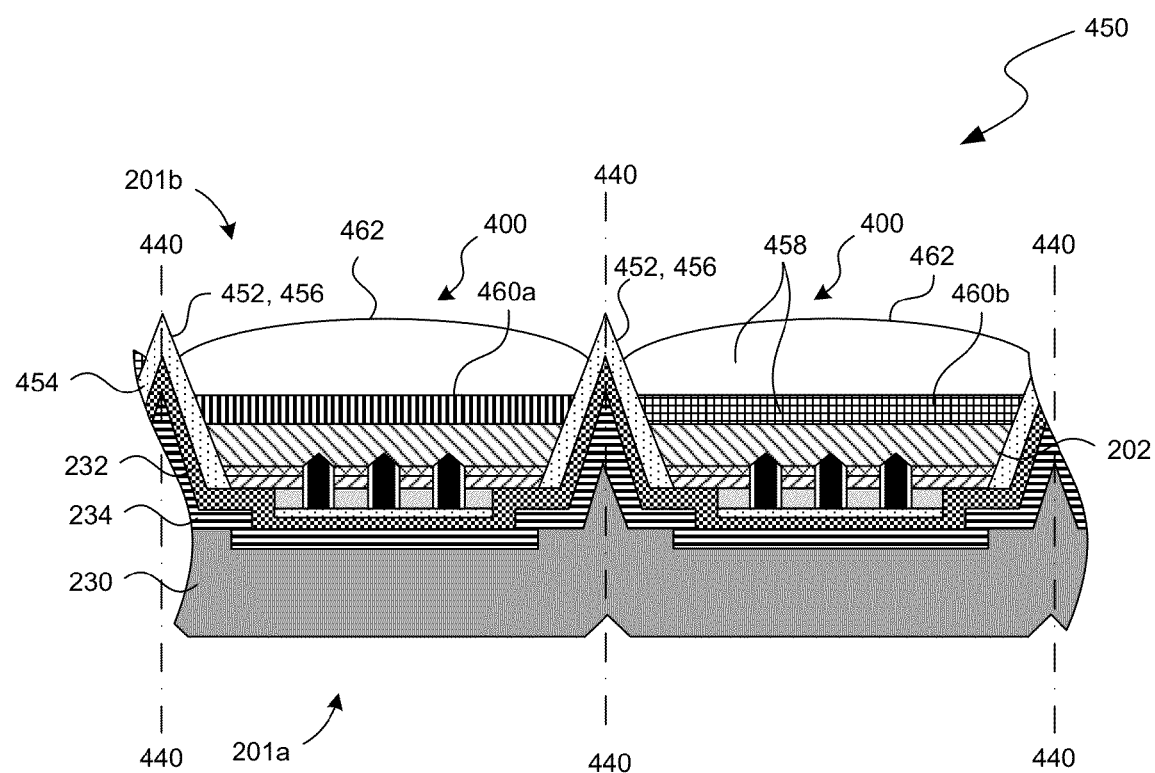

FIGS. 4A-4C are cross-sectional views illustrating a process of forming SSTs 400 on a wafer-level assembly 450 ("assembly 450") in accordance with a further embodiment of the present technology. The assembly 450 can include features generally similar to those of the assemblies 250 and 350 described above with reference to FIGS. 2A-3C, and can accordingly be formed using generally similar processes. FIG. 4A, for example, illustrates a stage in the process after the transducer structure 202 has been formed on the growth substrate 220, and after the backside first and second contacts 204 and 206 have been formed on the transducer structure 202. In the illustrated embodiment, the second contact 206 includes buried contact elements 415 that are generally similar to the buried contact elements 215 shown in FIGS. 2A-2K. However, as shown in FIG. 4A, the buried contact elements 415 include pointed (e.g., rather than rounded) end portions projecting into the second semiconductor material 212. In other embodiments, the buried contact elements 415 can include end portions with other suitable cross-sectional shapes (e.g., irregular, square). For clarity, the conductive lines interconnecting the buried contact elements 215 are not shown.

As shown in FIG. 4A, the assembly 450 can further include a plurality of trenches 451 that separate portions of the transducer structure 202. The trenches 451 can be aligned with dicing lanes 440 and can define the lateral dimensions of the individual SSTs 400. In the illustrated embodiment, the trenches 451 have a generally V-shaped cross-section with sidewalls 453 that extend from the first side 201a of the SSTs 400 into a portion of the growth substrate 220. In other embodiments, the trenches 451 can have other suitable shapes (e.g., rounded, trapezoidal, rectangular, etc.) and/or can extend from various surfaces over the transducer structure 202. For example, the trenches 451 can be formed concurrently with or after the first contact 204 such that the trenches 451 extend through the first contact 204 into the growth substrate 220. In some embodiments, the trenches 451 can be formed by positioning a mask (not shown) over the first side 201a of the SST 200 and etching (e.g., wet etch, dry etch, etc.) through the underlying exposed portions (e.g., the first contact 204, the transducer structure 202, the growth substrate 220). In other embodiments, the trenches 451 can be formed using other suitable methods known in the art.

FIG. 4B illustrates a stage of the process after separators 452 and the carrier substrate 230 have been formed on the first side 201a of the SST 200. One or more materials can partially or fully fill the trenches 451 (FIG. 4A) to form the separators 452. In the embodiment illustrated in FIG. 4A, for example, the separators 452 include dielectric isolators 454, the barrier material 232, the seed material 234, and the carrier substrate 230 formed sequentially over one another along the sidewalls 453 of the trenches 451. The dielectric isolators 454 can be an oxide passivation layer made from silicon oxide ($SiO_2$) or other suitable dielectric material such that the dielectric isolators 454 electrically isolate portions of the transducer structure 202. In various embodiments, the dielectric material 222 formed over the first contact 204 extends into the trenches 451 to serve as the dielectric isolators 454. In other embodiments, additional materials can be added to the separators 452 and/or one or more can be omitted. For example, the separators 452 can be made entirely of a dielectric material instead of a conformal dielectric. Each material can be formed using CVD, PVD, ALD, spin coating, patterning, plating, and/or other suitable techniques known in the art. Additional methods for forming the separators 452 can be found in U.S. Patent Application Publication No. 2013/0026499 entitled "WAFER-LEVEL PACKAGING FOR SOLID-STATE TRANSDUCERS AND ASSOCIATED SYSTEMS AND METHODS."

Figure 4D:
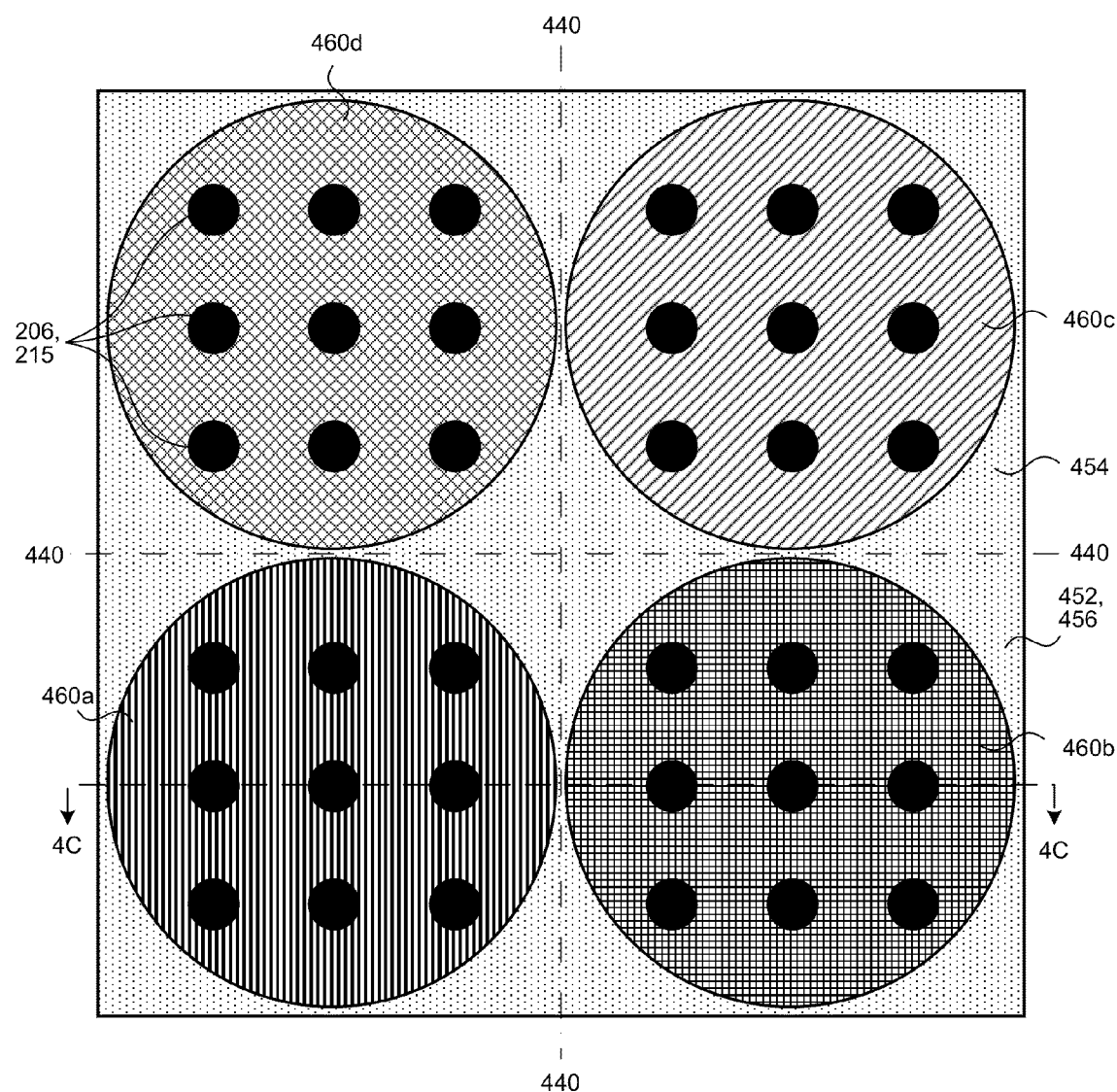
FIGS. 4D and 4E are front and backside plan views, respectively, of the solid-state transducers of FIG. 4C in accordance with an embodiment of the present technology.
Figure 4E:
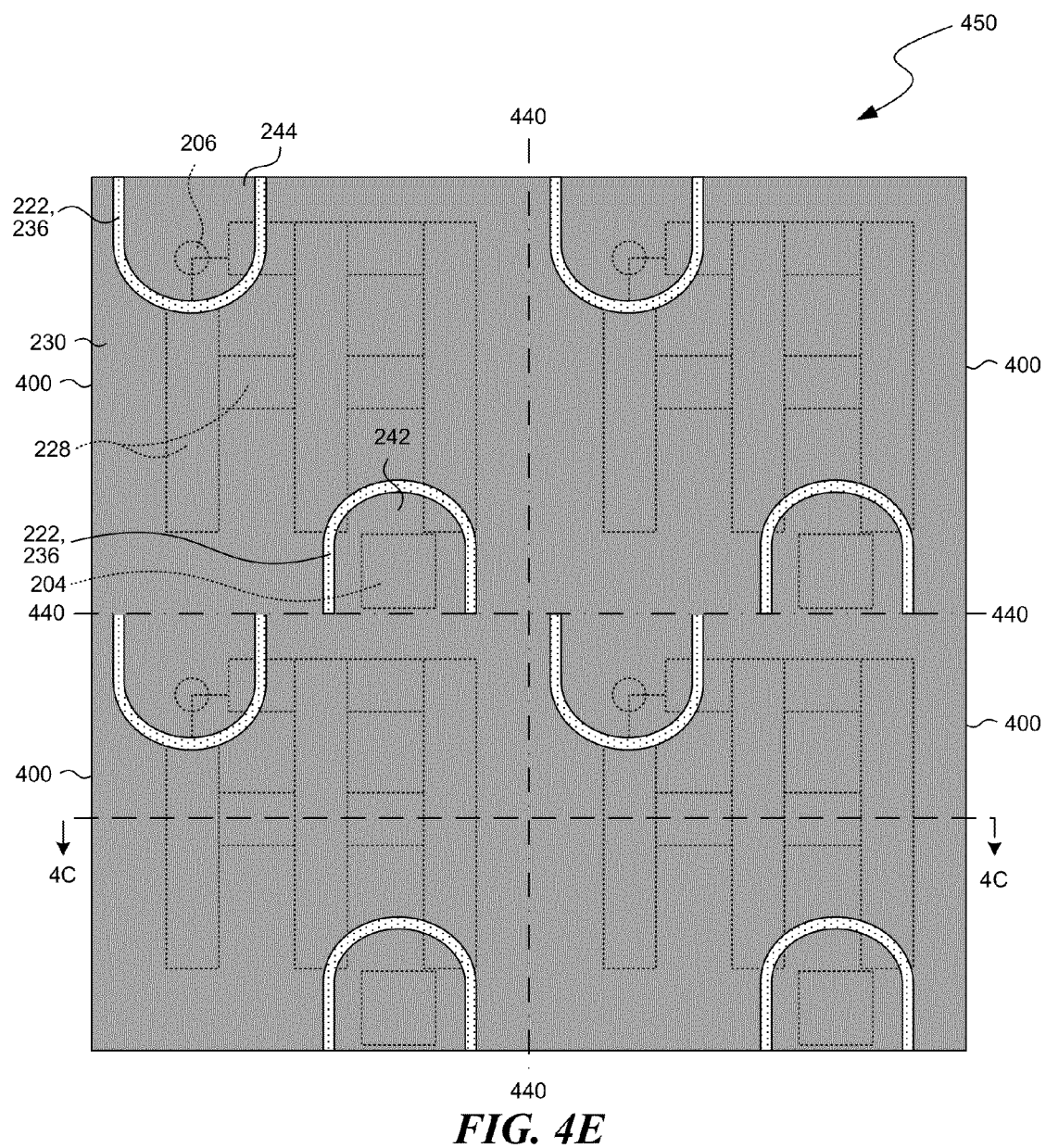

FIGS. 4C-4E are cross-sectional, front plan, and backside plan views illustrating another stage in the process after the growth substrate 220 has been removed and the assembly 450 has been inverted. The growth substrate 220 can be removed by backgrinding, etching, and/or other suitable removal methods. For example, removing the growth substrate 220 can include backgrinding the growth substrate 220 to the ends of the separators 452, and etching the remaining portions of the growth substrate 220 away from the sidewalls 453 of the separators 452 and the second semiconductor material 214.

As shown in FIG. 4C, the removal of the growth substrate 220 can leave at least a portion of the separators 452 projecting beyond the second side 208b to form protrusions 456 between the individual SSTs 400. The protrusions 456 can project a selected distance away from the second side 201b of the SST 200 (e.g., between approximately 10 µm and approximately 30 µm). In the illustrated embodiment, the protrusions 456 have an inverted, generally V-shaped cross-section (FIG. 4C) and form a border (FIG. 4D) around the individual SSTs 400. In other embodiments, the protrusions 456 can have other suitable cross-sectional shapes (e.g., rectangular, circular, trapezoidal, etc.). The border around the individual SSTs 400 can be rectangular, oval, hexagonal, and/or any other suitable shape. The protrusions 456 can be aligned with the dicing lanes 440 to demarcate a dicing pattern between individual SSTs 400 and thereby serve as guides during dicing.

As further shown in FIG. 4C, optical elements 458 can be formed on the second side 201b of the SST 200. In the embodiment illustrated in FIG. 4C, for example, the optical elements 458 include converter elements 460 and cover elements 462. The converter elements 460 can include a phosphor containing a doped yttrium aluminum garnet (YAG) (e.g., cerium (III)) at a particular concentration for emitting a range of colors under photoluminescence. In other embodiments, the converter elements 460 can include silicate phosphor, nitrate phosphor, aluminate phosphor, and/or other suitable wavelength conversion materials. Emissions (e.g., light) from the transducer structure 202 can irradiate the converter elements 460, and the irradiated converter elements 460 can emit a light of a certain quality (e.g., color, warmth, intensity, etc.). The converter elements 460 can be formed using ink jetting techniques, spin coating and patterning, CVD, PVD, and/or other suitable deposition techniques.

The cover elements 462 can transmit emissions generated by the transducer structure 202 and/or the converter elements 460. In the illustrated embodiment, the cover elements 462 are formed into generally hemispherical lenses over each of the SSTs 400. In other embodiments, the cover elements 462 can be formed into lenses having different shapes to collimate, scatter, and/or otherwise diffract light or other emissions from the transducer structure 202 and the converter elements 460. The cover elements 462 can include a transmissive material made from silicone, polymethylmethacrylate (PMMA), resin, or other suitable transmissive materials. In some embodiments, the cover elements 462 include an additional converter element (not shown) that emits light at a different frequency than the converter elements 460 proximate the transducer structure 202.

The cover elements 462 can be formed by injection molding, spin coating and patterning, CVD, PVD, and/or other suitable techniques. In other embodiments, the cover elements 462 can be preformed into lenses that are subsequently attached over the individual SSTs 400. In further embodiments the cover elements 462 and the converter elements 460 can be formed integrally. In still further embodiments, each cover element 462 can be positioned over multiple SSTs 400, one cover element 462 can be positioned over the entire wafer-level assembly 450, or the cover elements 462 can be omitted.

The protrusions 456 can act as barriers between the SSTs 400 that facilitate forming the discrete optical elements 458 over the individual SSTs 400, without the optical elements 458 spreading onto or otherwise contacting the adjacent SSTs 400. Accordingly, the SSTs 400 can be fully packaged at the wafer-level before dicing. Additionally, the protrusions 456 can act as barriers to selectively deposit different optical elements 458 on adjacent SSTs 400 based on desired performance parameters (e.g., color, intensity, etc.). As shown in FIG. 4D, for example, the assembly 450 can include a differently colored converter element 460 (identified individually as first-fourth converter elements 460a-d) on each of the SSTs 400. The assembly 450 can be subsequently diced to form individual SSTs 400 that emit different colors, or the SSTs 400 can remain unsingulated for use as a multi-colored device.

In one embodiment, the assembly 450 can be configured as a red-white-green-blue ("RWGB") device. The first converter element 460a can include yellow phosphor that mixes with blue light emitted by the transducer structure 202 to form a white pixel. The second and third converter elements 460b and 460c can include red and green phosphors, respectively, that fully convert the blue light from the transducer structure 202 to form corresponding red and green pixels. The fourth converter element 460d can be omitted to transmit the blue emissions from the transducer structure 202. The RWGB device can be used in displays, monitors, televisions, and/or other suitable multi-color applications. In other embodiments, the converter elements 460 can be arranged differently (e.g., one red, one blue, and two green converter elements 460) and/or the assembly 450 can include differently colored converter elements 460. In further embodiments, other performance parameters (e.g., intensity) of the optical elements 458 can vary between adjacent SSTs 400.

The wafer 450 facilitates formation, packaging, and integration of the SSTs 400. The separators 452, for example, facilitate wafer-level formation of the optical elements 458, and thus substantially eliminate packaging steps after the SSTs 400 are diced. The fully packaged SSTs 400 can also be tested at the wafer-level. As shown in FIG. 4E, the first and second terminals 242 and 244 can provide electrical access to the first and second contacts 204 and 206 on the backside of the carrier substrate 230. Accordingly, the SSTs 400 provide enhanced emission efficiencies and wirebond-free packaging suitable for applications with tight die spacing. Additionally, the carrier substrate 230 can serve as a thermal pad to remove heat from the SSTs 400 during operation and enhance performance.

Figure 4F:
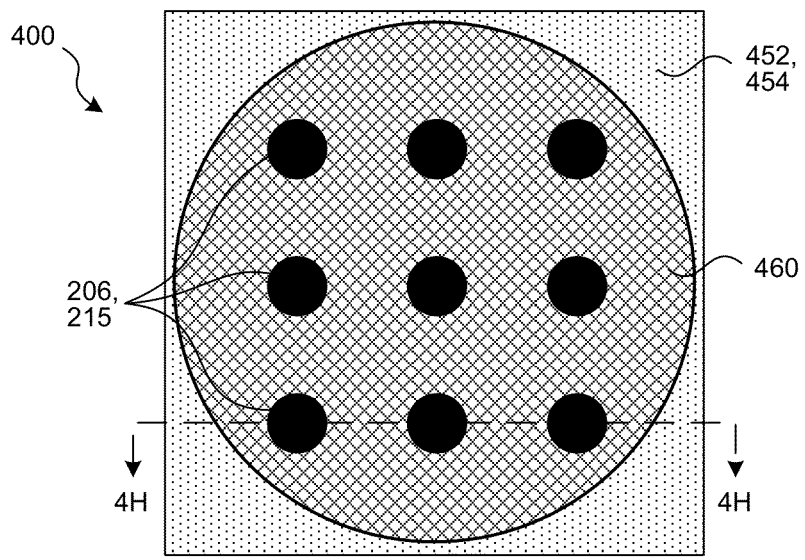
FIGS. 4F-4H are schematic front plan, cross-sectional, and backside plan views, respectively, of a solid-state transducer configured in accordance with an embodiment of the present technology.
Figure 4G:
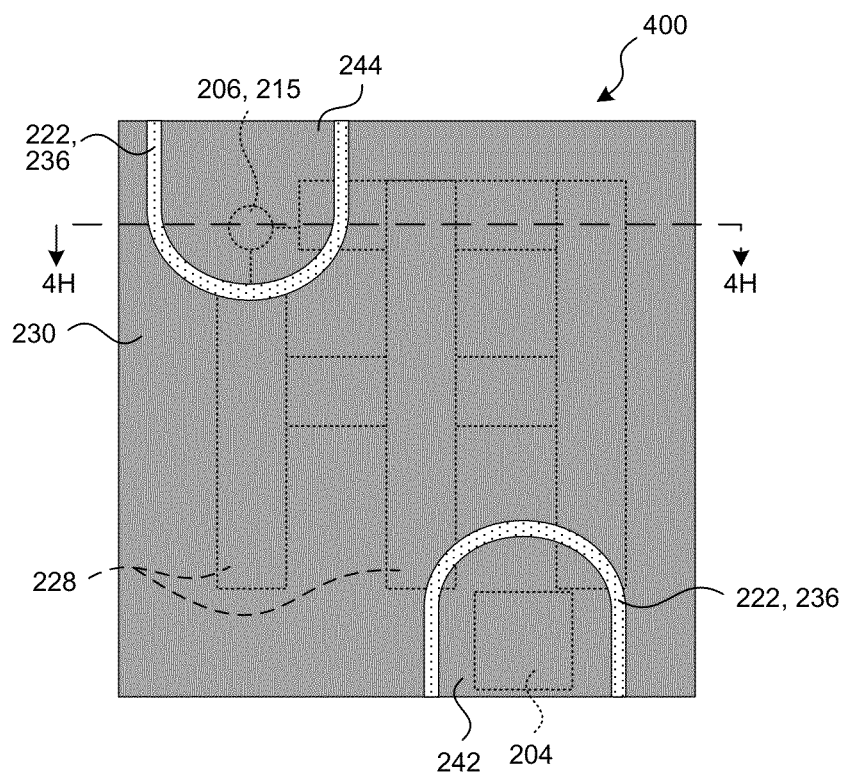
Figure 4H:
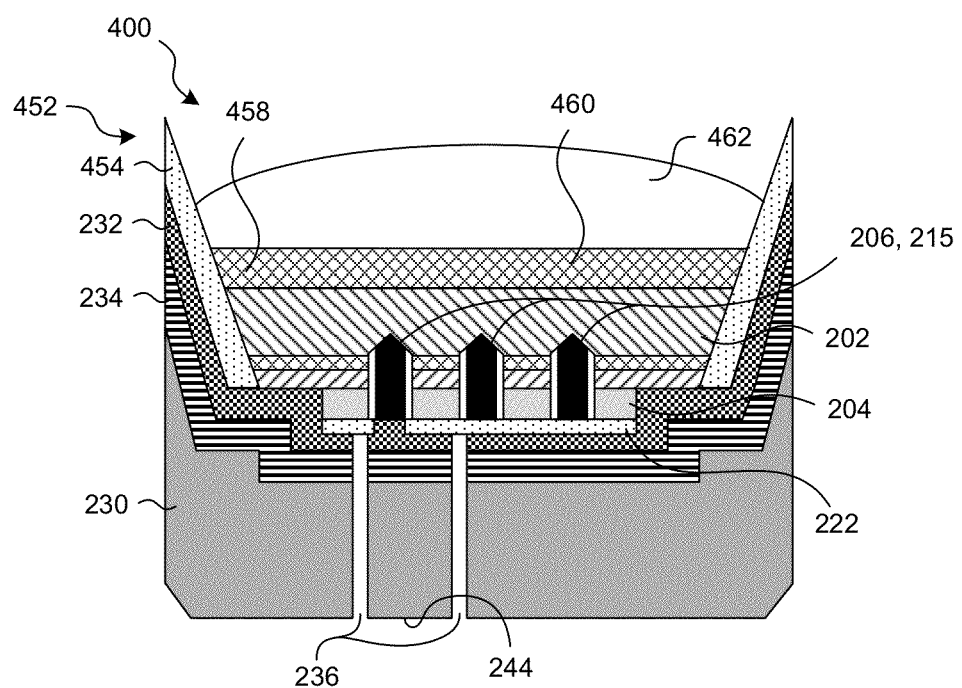

FIGS. 4F-4H are schematic front plan, backside plan, and cross-sectional views, respectively, of one of the SSTs 400 diced from the assembly 450 of FIGS. 4C-4E. As shown in FIGS. 4F and 4H, dicing along the dicing lanes 440 forms a raised peripheral portion defined by the separators 452 that borders the transducer structure 202, the converter element 460, and the cover element 462. In other embodiments, the separators 452 can be removed from the SST 400 during dicing and/or subsequent removal processes. After dicing, the packaged SST 400 is ready to be integrated into devices for backlighting, general illumination, and/or other emissions in the ultraviolet, visible, infrared, and/or other spectra. As shown in FIG. 4G, the backside first and second terminals 242 and 244 facilitate mounting the SST 400 without wirebonds. Additionally, the conductive carrier substrate 230 can enhance the thermal performance of the SST 400 by conveying heat away from transducer structure 202.

Figure 5:
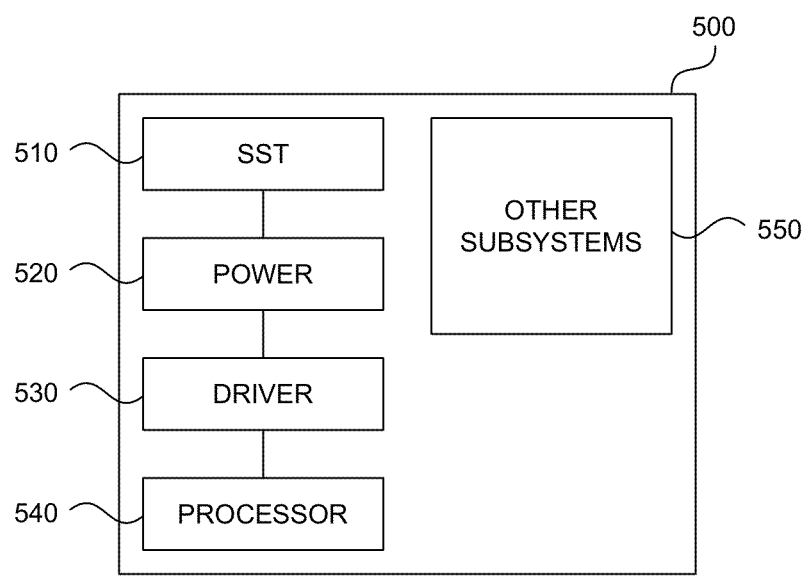
FIG. 5 is a schematic view of a system that incorporates a packaged solid-state transducer device in accordance with embodiments of the present technology.

Any of the packaged SSTs described above with reference to FIGS. 2A-4H can be incorporated into any of a myriad of larger and/or more complex systems, a representative example of which is system 500 shown schematically in FIG. 5. The system 500 can include an SST device 510, a power source 520, a driver 530, a processor 540, and/or other subsystems or components 550. The resulting system 500 can perform any of a wide variety of functions, such as backlighting, general illumination, power generation, sensors, and/or other functions. Accordingly, representative systems 500 can include, without limitation, hand-held devices (e.g., cellular or mobile phones, tablets, digital readers, and digital audio players), lasers, photovoltaic cells, remote controls, computers, and appliances (e.g., refrigerators). Components of the system 500 may be housed in a single unit or distributed over multiple, interconnected units (e.g., through a communications network). The components of the system 500 can also include local and/or remote memory storage devices, and any of a wide variety of computer-readable media.

From the foregoing, it will be appreciated that specific embodiments of the technology have been described herein for purposes of illustration, but that various modifications may be made without deviating from the disclosure. For example, each of the SSTs 200, 300, and 400 shown in the Figures includes nine interconnected buried contact elements 215. In other embodiments, however, the first contact can include one, two, three, four, or any other suitable number of buried contact elements. Additionally, the SST assemblies shown in the Figures include 2×2 arrays of SSTs. In other embodiments, however, assemblies can include arrays having different numbers of SSTs and/or the arrays can have different shapes (e.g., rectangular, circular). Certain aspects of the new technology described in the context of particular embodiments may be combined or eliminated in other embodiments. For example, the configuration of the first and second terminals 242 and 244 shown in FIG. 2H can be combined with the separators 452 described with reference to FIGS. 4A-4H. Additionally, while advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A solid-state transducer (SST) having a first side and a second side facing away from the first side, comprising:
    a transducer structure having a first semiconductor material at the first side of the SST, a second semiconductor material at the second side of the SST, and an active region between the first and second semiconductor materials;
    a first contact on the first side of the SST and electrically coupled to the first semiconductor material, wherein the first contact includes an isolated portion covered by a dielectric material and an exposed portion not covered by the dielectric material;
    a second contact on the first side of the SST and electrically coupled to the second semiconductor material, the second contact comprising—
        a plurality of interconnected buried contact elements that extend from the first side of the SST into the second semiconductor material, wherein the buried contact elements are electrically isolated from the active region, the first semiconductor material, and the first contact;
        a plurality of conductive lines on the dielectric material and interconnecting the buried contact elements,
        wherein the second contact includes an isolated portion covered by dielectric portions and an exposed portion not covered by the dielectric portions; and
    a conductive carrier substrate over the dielectric material on first side of the SST, wherein the conductive carrier substrate defines a first terminal electrically coupled to the first contact and a second terminal electrically coupled to the second contact;
    an isolating via extending through the conductive carrier substrate to the dielectric material, the isolating via surrounding the exposed portion of the first contact;
    a plurality of separators extending from the first side of the SST beyond the second semiconductor material to form a plurality of protrusions, wherein the separators define individual SST dies; and
    a conductive material on the dielectric portions, the dielectric material, and the exposed portions of the first and second contacts, wherein the conductive material contacts the exposed portions, and wherein the conductive carrier substrate is configured to be formed on the conductive material.

2. The SST of claim 1 wherein the separators comprise a dielectric isolator adjacent to the transducer structure.

3. The SST of claim 1 wherein the separators are aligned with dicing lanes.

4. The SST of claim 1 wherein the protrusions are on the second side of the SST around a periphery of the individual SST dies, and wherein an optical element is confined within the protrusion.

5. The SST of claim 1 wherein the individual SST dies are configured to emit electromagnetic radiation in at least one of the ultraviolet spectrum, the visible spectrum, and the infrared spectrum.

6. A solid-state transducer (SST) having a first side and a second side facing away from the first side, comprising:
    a transducer structure having a first semiconductor material at the first side of the SST, a second semiconductor material at the second side of the SST, and an active region between the first and second semiconductor materials;
    a first contact on the first side of the SST and electrically coupled to the first semiconductor material, wherein the first contact includes an isolated portion covered by a dielectric material and an exposed portion not covered by the dielectric material;
    a second contact on the first side of the SST and electrically coupled to the second semiconductor material, the second contact comprising a plurality of interconnected buried contact elements;
    a conductive carrier substrate over the dielectric material on first side of the SST, wherein the conductive carrier substrate defines a first terminal electrically coupled to the first contact and a second terminal electrically coupled to the second contact;
    a first isolating via extending through the conductive carrier substrate to the dielectric material, the first isolating via surrounding the exposed portion of the first contact and defining the first terminal at a backside of the conductive carrier substrate, the backside being on the first side of the SST;
    a second isolating via extending through the conductive carrier substrate to the dielectric material, the second isolating via surrounding the exposed portion of the second contact; and
    a plurality of separators extending from the first side of the SST beyond the second semiconductor material to form a plurality of protrusions, wherein the separators define individual SST dies.

7. The SST of claim 6, further comprising:
    a plurality of discrete optical elements on the second side of the SST, wherein the protrusions act as barriers between the discrete optical elements.

8. The SST of claim 7 wherein the plurality of discrete optical elements comprises at least one of a plurality of discrete converter elements and a plurality of discrete cover elements, and wherein the protrusions separate the discrete converter elements and the discrete cover elements.

9. The SST of claim 7 wherein the discrete optical elements comprise:
    a first converter element on a first SST die, the first converter element being configured to emit light having a first color; and
    a second converter element on a second SST die adjacent to the first SST die, the second converter element being configured to emit light having a second color different from the first color.

10. A method of forming solid-state transducers (SSTs) having a first side and a second side, the method comprising:
    forming a transducer structure having an active region positioned between a first semiconductor material and a second semiconductor material, wherein the first semiconductor material is at the first side of the SST and the second semiconductor material is at the second side of the SST;
    forming a first contact electrically coupled to the first semiconductor material and on the first side of the SSTs;

forming a second contact electrically coupled to the second semiconductor material and on the first side of the SST, wherein the second contact includes a plurality of interconnected buried contact elements;

forming a dielectric material on the first side of the SST, wherein the first contact includes an isolated portion covered by the dielectric material and an exposed portion not covered by the dielectric material;

disposing a conductive carrier substrate on the dielectric material over the first side of the SSTs, wherein the conductive carrier substrate defines a first terminal electrically coupled to the first contact and a second terminal electrically coupled to the second contact;

forming an isolating via extending through the conductive carrier substrate to the dielectric material, the isolating via surrounding the exposed portion of the first contact; and forming a plurality of separators extending from the first side of the SSTs beyond the second semiconductor material to form a plurality of protrusions, wherein the separators define individual SSTs, and wherein forming the plurality of separators comprises— forming a plurality of trenches from the first side of the SST, wherein the trenches have sidewalls that extend from at least the first semiconductor material beyond the second semiconductor material into an underlying growth substrate;

depositing a dielectric isolator into the trenches; and removing the growth substrate from the second semiconductor material and from the sidewalls such that the separators form the plurality of protrusions extending beyond the second semiconductor material.

* * * * *